(12) United States Patent
Gan et al.

(10) Patent No.: US 8,975,703 B2
(45) Date of Patent: Mar. 10, 2015

(54) MOS TRANSISTOR, FORMATION METHOD THEREOF, AND SRAM MEMORY CELL CIRCUIT

(71) Applicant: Semiconductor Manufacturing International Corp., Shanghai (CN)

(72) Inventors: Zhenghao Gan, Shanghai (CN); Junhong Feng, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 64 days.

(21) Appl. No.: 13/739,311

(22) Filed: Jan. 11, 2013

(65) Prior Publication Data
US 2013/0341726 A1    Dec. 26, 2013

(30) Foreign Application Priority Data
Jun. 26, 2012 (CN) .......................... 2012 1 0214272

(51) Int. Cl.
*H01L 29/78* (2006.01)
*H01L 27/092* (2006.01)
(Continued)

(52) U.S. Cl.
CPC ........ *H01L 27/092* (2013.01); *H01L 29/66477* (2013.01); *H01L 27/1104* (2013.01); *H01L 29/66636* (2013.01); *H01L 29/66659* (2013.01); *H01L 29/7848* (2013.01)
USPC ........... 257/368; 257/369; 438/197; 438/199; 438/301; 438/286

(58) Field of Classification Search
CPC ................... H01L 29/0847; H01L 29/66636; H01L 29/7842; H01L 29/7848; H01L 21/823418; H01L 21/823425; H01L 21/823814; H01L 21/02381

USPC .......... 257/368, 369; 438/286, 197, 199, 301, 438/302, 303
See application file for complete search history.

(56) References Cited

U.S. PATENT DOCUMENTS

2007/0241411 A1    10/2007  Yang et al.
2008/0251851 A1*  10/2008  Pan et al. ...................... 257/369
(Continued)

OTHER PUBLICATIONS

Kah-Wee Ang, King-Jien Chui, Chih-Hang Tung, N. Balasubramanian, Ming-Fu Li, Ganesh S. Samudra and Yee-Chia Yeo "Enhanced Strain Effects in 25-nm Gate-Length Thin-Body nMOSFETs With Silicon—Carbon Source/Drain and Tensile-Stress Liner" IEEE Electron Device Letters, vol. 28, No. 4, pp. 301-304, Apr. 2007.

(Continued)

*Primary Examiner* — Matthew W Such
*Assistant Examiner* — Scott Stowe
(74) *Attorney, Agent, or Firm* — Anova Law Group, PLLC

(57) ABSTRACT

Various embodiments provide an MOS transistor, a formation method thereof, and an SRAM memory cell circuit. An exemplary MOS transistor can include a semiconductor substrate including a first groove on one side of a gate structure and a second groove on the other side of the gate structure. The first groove can have a sidewall perpendicular to a surface of the semiconductor substrate. The second groove can have a sidewall protruding toward a channel region under the gate structure. A stressing material can be disposed in the first groove to form a drain region and in the second groove to form a source region. Stress generated in the channel region of the MOS transistor can be asymmetric. The MOS transistor can be used as a transfer transistor in an SRAM memory cell circuit to increase both read and write margins of the SRAM memory.

15 Claims, 7 Drawing Sheets

(51) Int. Cl.
*H01L 29/66* (2006.01)
*H01L 27/11* (2006.01)

(56) References Cited

U.S. PATENT DOCUMENTS

2010/0163939 A1* 7/2010 Kronholz et al. ............. 257/288
2010/0171181 A1* 7/2010 Rhee et al. .................... 257/369
2011/0220964 A1* 9/2011 Shin et al. ..................... 257/183
2012/0056276 A1* 3/2012 Cheng et al. .................. 257/408

OTHER PUBLICATIONS

Jae-Joon Kim, Aditya Bansal, Rahul Rao, Shih-Hsien Lo, Ching-Te Chuang "Relaxing Conflict Between Read Stability and Writability in 6T SRAM Cell Using Asymmetric Transistors" IEEE Electron Device Letters, vol. 30, No. 8, pp. 852-854, Aug. 2009.

* cited by examiner

MOS TRANSISTOR, FORMATION METHOD THEREOF, AND SRAM MEMORY CELL CIRCUIT

CROSS-REFERENCES TO RELATED APPLICATIONS

This application claims priority to Chinese Patent Application No. CN201210214272.2, filed on Jun. 26, 2012, the entire contents of which are incorporated herein by reference.

FIELD OF THE DISCLOSURE

The present disclosure relates to the field of semiconductor technology and, more particularly, relates to MOS transistors, static random access memory (SRAM) memory cell circuits, and methods for forming the MOS transistors.

BACKGROUND

Static random access memory (SRAM), as one of memory devices, has advantages including high speed, low power consumption, and compatibility with industry standard technologies. SRAM is widely used in areas such as personal computers (PC), personal communications, and consumer electronic products (e.g., smart cards, digital cameras, and multimedia players).

FIG. 1 is a schematic illustrating a circuit of a memory cell of a conventional six-transistor (6T) SRAM memory. The memory cell includes a first PMOS transistor P1, a second PMOS transistor P2, a first NMOS transistor N1, a second NMOS transistor N2, a third NMOS transistor N3, and a fourth NMOS transistor N4.

The first PMOS transistor P1, the second PMOS transistor P2, the first NMOS transistor N1, and the second NMOS transistor N2 form a bistable circuit. The bistable circuit forms a latch for latching data information. The first PMOS transistor P1 and the second PMOS transistor P2 are pull-up transistors. The first NMOS transistor N1 and the second NMOS transistor N2 are pull-down transistors. The third NMOS transistor N3 and the fourth NMOS transistor N4 are transfer transistors.

A gate of the first PMOS transistor P1, a gate of the first NMOS transistor N1, a drain of the second PMOS transistor P2, a drain of the second NMOS transistor N2, and a source of the fourth NMOS transistor N4 are electrically connected forming a first storage node 11. A gate of the second PMOS transistor P2, a gate of the second NMOS transistor N2, a drain of the first PMOS transistor P1, a drain of the first NMOS transistor N1, and a source of the third NMOS transistor N3 are electrically connected forming a second storage node 12.

Gates of the third NMOS transistor N3 and the fourth NMOS transistor N4 are electrically connected to a word line WL. A drain of the third NMOS transistor N3 is electrically connected to a first bit line BL. A drain of the fourth NMOS transistor N4 is electrically connected to a second bit line (complementary bit line) BLB. A source of the first PMOS transistor P1 and a source of the second PMOS transistor P2 are electrically connected to a power supply line Vdd. A source of the first NMOS transistor N1 and a source of the second NMOS transistor N2 are electrically connected to a ground line Vss.

In a read operation of the SRAM memory, current may flow from the first bit line BL and the second bit line BLB that are set at a high level to the first storage node 11 or the second storage node 12 that is set at a low level. In a write operation of the SRAM memory, current may flow from the first storage node 11 or the second storage node 12 that is set at a high level to the first bit line BL or the second bit line BLB that is set at a low level.

However, SRAM memories face challenges in reading/writing stability, as process node shrinks in complementary metal-oxide-semiconductor (CMOS) manufacturing processes with reduced operating voltages and increased variations of threshold voltages due to random doping. To allow an SRAM memory to be stably operated, it is necessary to increase read and write margins of the SRAM memory.

Therefore, there is a need to provide MOS transistors, SRAM memory cell circuits, and fabrication methods to increase read and write margins of an SRAM memory.

BRIEF SUMMARY OF THE DISCLOSURE

According to various embodiments, there is provided an MOS transistor. The MOS transistor can include a semiconductor substrate and a gate structure disposed on a surface of the semiconductor substrate. The semiconductor substrate can include a first groove on one side of the gate structure and a second groove on an other side of the gate structure. The first groove can have a sidewall perpendicular to the surface of the semiconductor substrate. The second groove can have a sidewall protruding toward a channel region under the gate structure. The MOS transistor can also include a stressing material disposed in each of the first groove and the second groove.

According to various embodiments, there is also provided a method of forming an MOS transistor. The MOS transistor can be formed by forming a gate structure on a surface of a semiconductor substrate. A first groove having a sidewall perpendicular to the surface of the semiconductor substrate can be formed in the semiconductor substrate on one side of the gate structure. A second groove having a sidewall protruding toward a channel region can be formed in the semiconductor substrate on an other side of the gate structure. Each of the first groove and the second groove can be filled with a stressing material to form a source region and a drain region.

According to various embodiments, there is further provided an SRAM memory cell circuit. The SRAM memory cell circuit can include a first transfer transistor and a second transfer transistor. The first transfer transistor can include a gate electrically connected to a word line, a source electrically connecting to a first storage node, and a drain electrically connecting to a first bit line. The second transfer transistor can include a gate electrically connected to the word line, a source electrically connecting to a second storage node, and a drain electrically connecting to a second bit line. Each of the first transfer transistor and the second transfer transistor can include a semiconductor substrate including a first groove on one side of the gate and a second groove on an other side of the gate. The first groove can have a sidewall perpendicular to the surface of the semiconductor substrate. The second groove can have a sidewall protruding toward a channel region under the gate structure. Each of the first transfer transistor and the second transfer transistor can also include a stressing material disposed in the first groove to form the drain and in the second groove to form the source.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Read and write stability of an SRAM memory can mainly be measured by, for example, parameters including read margin and write margin. The read margin is a maximum noise voltage that an SRAM memory can tolerate in a read operation, provided that a storage state is kept unchanged or consistent. The write margin is a maximum noise voltage that an SRAM memory can tolerate in a write operation, provided that the storage state is kept unchanged or consistent. In general, the higher the read and write margins, the better the read and write stability of the SRAM memory. The read margin can depend on a ratio between a source-drain saturation current of a pull-down NMOS transistor and a source-drain saturation current of a transfer NMOS transistor. The write margin can depend on a ratio between the source-drain saturation current of the transfer NMOS transistor and a source-drain saturation current of a pull-up PMOS transistor.

When structures of the pull-up PMOS transistor and the pull-down NMOS transistor are kept unchanged or consistent, the read margin can be increased by decreasing a drain-to-source source-drain saturation current of the transfer NMOS transistor. When the structures of the pull-up PMOS transistor and the pull-down NMOS transistor are kept unchanged or consistent, the write margin can be increased by increasing a source-to-drain source-drain saturation current of the transfer NMOS transistor.

Figure 1:
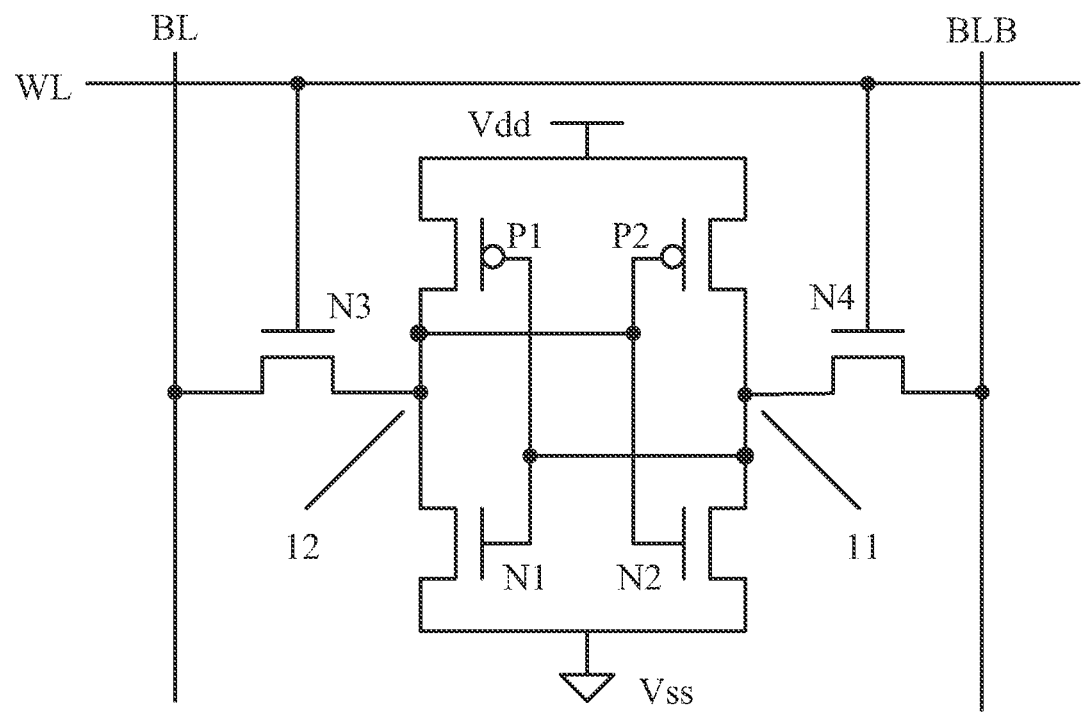
FIG. 1 depicts a schematic illustrating a circuit of a memory cell of a conventional SRAM memory.

The source and drain of each of the transfer NMOS transistors (e.g., the third NMOS transistor N3 and the fourth NMOS transistor N4 as shown in FIG. 1) are often symmetric. Accordingly, the source-to-drain source-drain saturation current and the drain-to-source source-drain saturation current of the transfer NMOS transistors should be the same. Therefore, using the transfer NMOS transistor to increase both the write margin and the read margin is contradictory. That is, increasing the read margin of the transfer NMOS transistor will result in decreasing of the write margin, and vice versa.

Various embodiments provide structures and methods for forming MOS transistors including an asymmetric stressing layer. An exemplary MOS transistor can include a channel region including an asymmetric stressing layer with asymmetric stress. In various embodiments, stress in source and drain regions of an exemplary MOS transistor can be asymmetric. Various embodiments also provide an SRAM memory cell circuit using the MOS transistor as a transfer transistor (or a pass gate transistor).

Exemplary MOS transistor can include a first groove and a second groove respectively formed in a semiconductor substrate on both sides of a gate structure. The first groove and the second groove can be filled with a stressing material. A sidewall of the first groove can be perpendicular to a surface of the semiconductor substrate. A sidewall of the second groove can protrude toward a channel region. When the MOS transistor is in a saturation region and a source-drain voltage is greater than or equal to a source-drain saturation voltage, the channel region can be pinched off. The channel region can then only exist between a channel pinch-off point and the source region or the drain region that is set at a low level.

Therefore, saturation mobility of carriers of the MOS transistor depends on the saturation mobility of the carriers in the channel region near a source region or a drain region that is set at the low level. That is, a source-drain saturation current of the MOS transistor depends on the saturation mobility of the carriers in the channel region near the source region or the drain region that is set at the low level. Since the sidewall of the second groove can protrude toward the channel region, accordingly, the stressing material in the second groove can protrude toward the channel region.

The stress exerted on the channel region near the second groove can be greater than the stress exerted on the channel region near the first groove. The source-drain saturation current of the MOS transistor can be different in a different current direction. When such MOS transistor, i.e., having a different source-drain saturation current in a different current direction, is used as a transfer transistor in an SRAM memory cell circuit, both the read and write margins of the SRAM memory cell can be increased.

Figure 2:
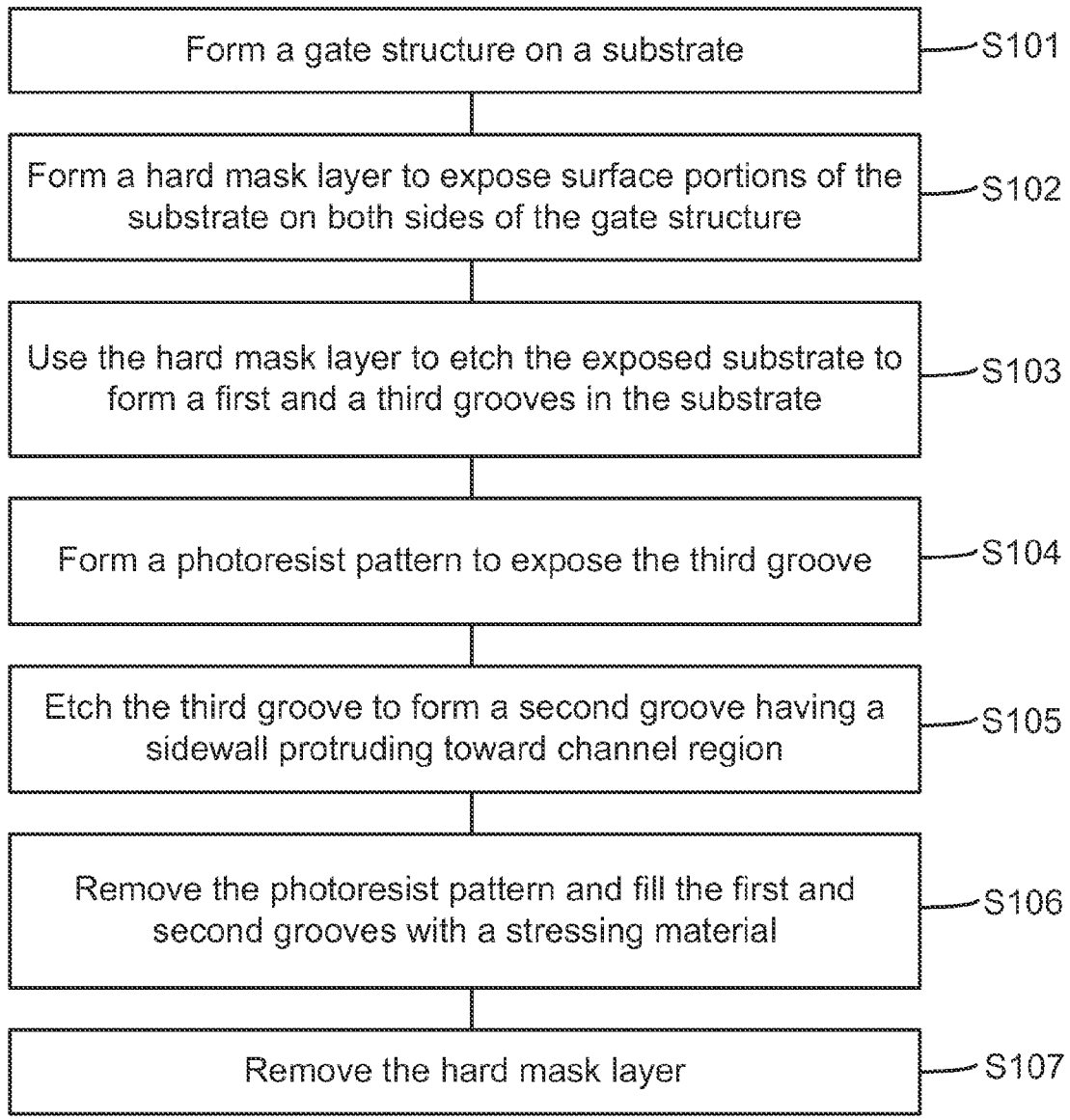
FIG. 2 depicts an exemplary method for forming an MOS transistor in accordance with various disclosed embodiments.

FIG. 2 depicts an exemplary method for forming an MOS transistor, and FIGS. 3-9 depict cross-sectional views of an exemplary MOS transistor at various stages during its formation in accordance with various disclosed embodiments. Note that although FIGS. 3-9 depict structures corresponding to the method depicted in FIG. 2, the structures and the method are not limited in any manner. The MOS transistor can be an NMOS transistor or a PMOS transistor. As described herein where appropriate, NMOS can be replaced by PMOS, or vice versa. In one embodiment, the MOS transistor can be used as a transfer transistor in an SRAM memory cell circuit.

Figure 3:
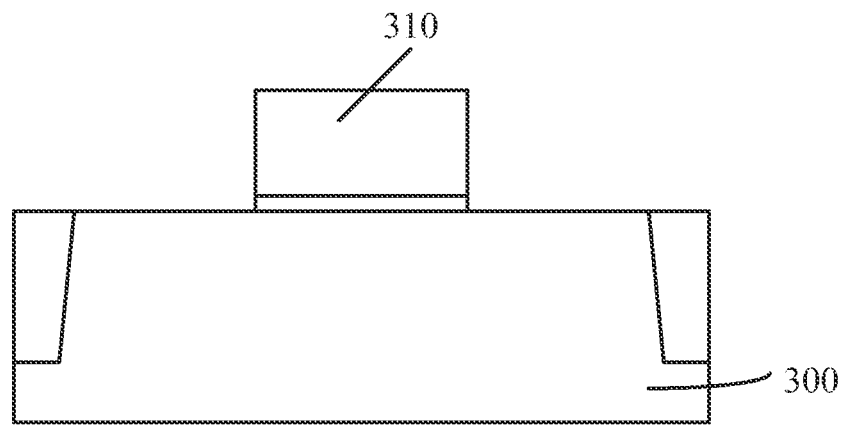
FIGS. 3-9 depict schematic cross-sectional views of an exemplary MOS transistor at various stages during its formation in accordance with various disclosed embodiments.

In Step S101 of FIG. 2 and referring to FIG. 3, a semiconductor substrate 300 can be provided. A gate structure 310 can be formed over/on a surface of the semiconductor substrate 300.

The semiconductor substrate 300 can be a single-crystal silicon substrate, a single-crystal germanium substrate, a silicon germanium substrate, and/or a silicon-on-insulator (SOI) substrate. An isolation structure (not shown), e.g., a shallow trench isolation structure, can be formed in the semiconductor substrate 300. The shallow trench isolation structure can be located between adjacent devices to electrically isolate the adjacent devices.

The gate structure 310 can include, for example, a gate dielectric layer, a gate electrode, and/or a sidewall spacer. The gate dielectric layer can be formed on the semiconductor substrate 300. The gate electrode can be formed on the gate dielectric layer. The sidewall spacer can be formed on sidewall surfaces of the gate dielectric layer and the gate electrode. The sidewall spacer may be formed before forming the subsequently-formed hard mask layer or may be formed after removing the subsequently-formed hard mask layer. The gate dielectric layer can be made of silicon oxide and/or high-K gate dielectric material including, e.g., hafnium oxide and/or zirconium oxide. The gate electrode can be, e.g., a polycrystalline silicon gate electrode or a metal gate electrode.

After forming the gate structure, slightly-doped regions may also be formed in the semiconductor substrate on both sides of the gate structure to alleviate a short channel effect and a hot carrier injection effect.

Figure 4:
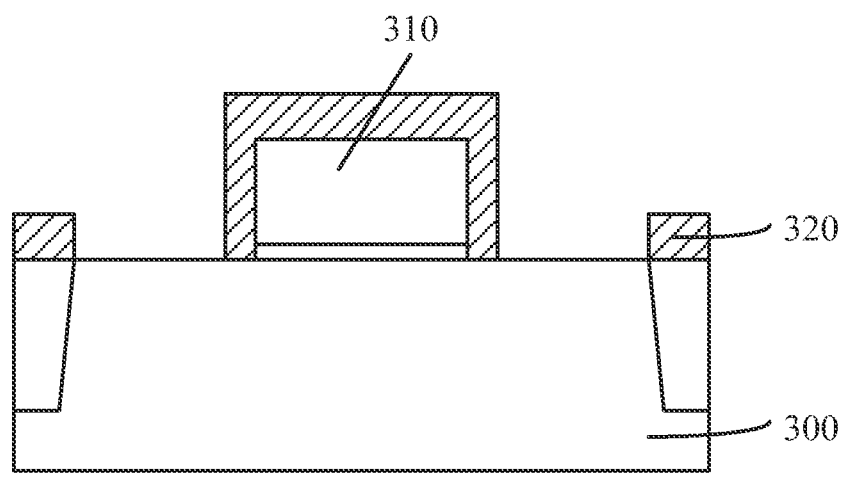

In Step S102 of FIG. 2 and referring to FIG. 4, a hard mask layer 320 can be formed on some surface portions of the semiconductor substrate 300 and on surface of the gate structure 310. The hard mask layer 320 can expose other surface portions of the semiconductor substrate 300 on both sides of the gate structure 310.

The hard mask layer 320 can be made of silicon oxide, silicon nitride, silicon oxynitride, and/or any suitable materials. In one embodiment, the hard mask layer 320 can be a layered structure formed by any suitable combinations of the above-mentioned materials. The hard mask layer 320 can be formed by a process including, e.g., forming a dielectric layer (not shown) on entire surfaces of the semiconductor substrate 300 and the gate structure 310; forming a photoresist patter (not shown) on the dielectric layer; and dry etching the dielectric layer by using the photoresist patter as a mask until the surface of the semiconductor substrate 300 is exposed to form the hard mask layer 320.

The exposed surface portions of the semiconductor substrate 300 can correspond to subsequently-formed regions including a source region and a drain region. The hard mask layer 320 can provide a mask for a subsequent formation of a first groove and a third groove, e.g., by a dry etching.

Figure 5:
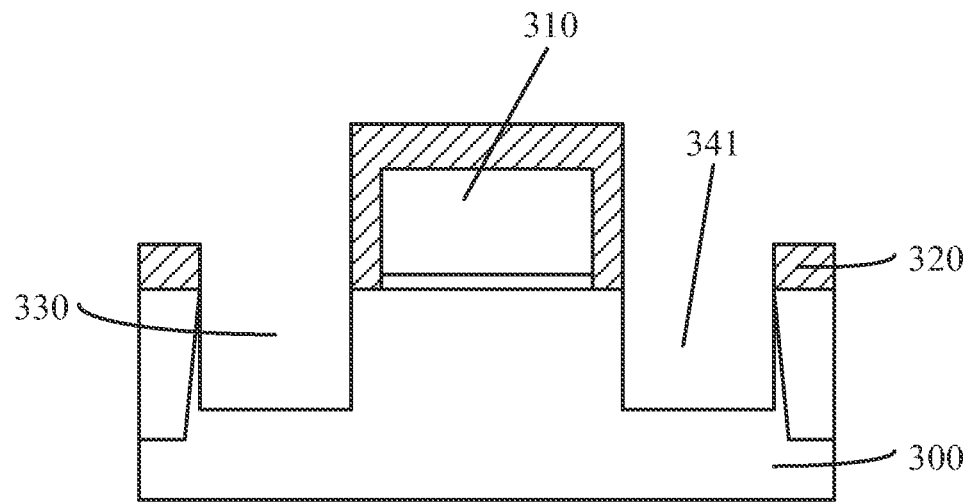

In Step S103 of FIG. 2 and referring to FIG. 5, the semiconductor substrate 300 can be partially etched, e.g., using the hard mask layer 320 as a mask to dry etch the exposed portions of the semiconductor substrate 300 on both sides of the gate structure 310. As a result, a first groove 330 and a third groove 341 can be formed. The first groove 330 and the third groove 341 can have sidewalls formed perpendicular to the surface of the semiconductor substrate 300. In one embodiment, the exemplary drying etching can be an anisotropic dry etching, which allows sidewalls of the formed first groove 330 and the third groove 341 to be perpendicular to the surface of the semiconductor substrate 300.

Figure 6:
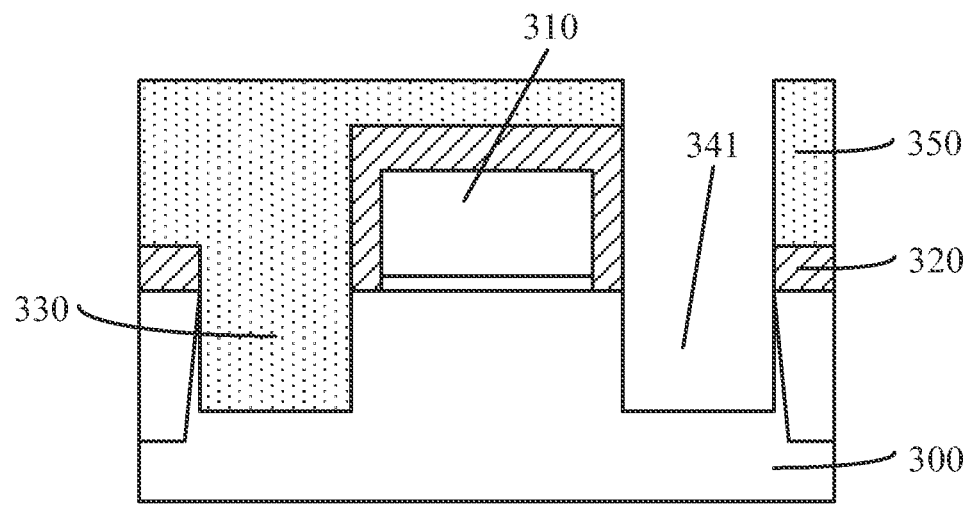

In Step S104 of FIG. 2 and referring to FIG. 6, a photoresist pattern 350 can be formed on surfaces of the hard mask layer 320 and the first groove 330. The photoresist pattern 350 can expose the third groove 341 to allow a subsequent etching process, e.g., a wet etching, to be performed only to the third groove 341.

Figure 7:
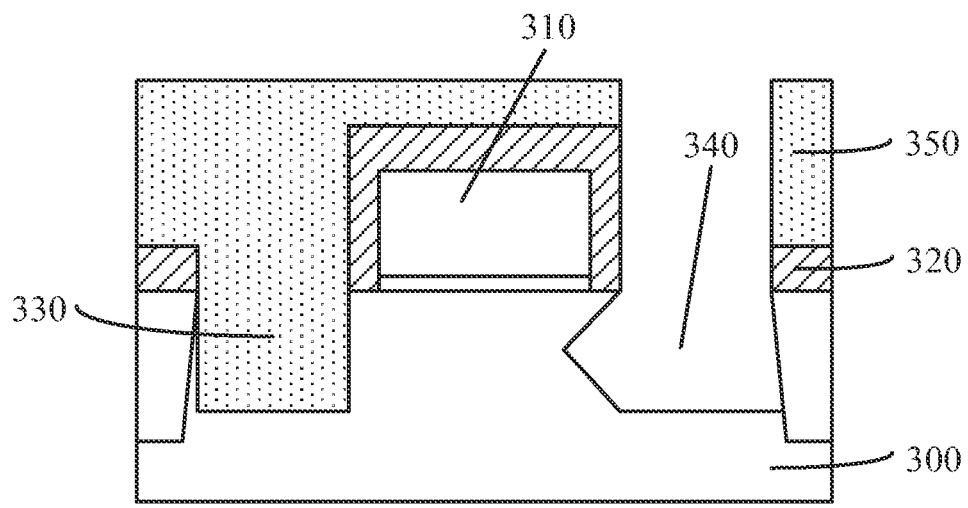

In Step S105 of FIG. 2 and referring to FIG. 7, the third groove 341 can be, e.g., wet etched to form a second groove 340 having a sidewall protruding toward a channel region under the gate electrode.

In some embodiments, the wet etching can use an etching solution including a potassium hydroxide solution or a tetramethyl ammonium hydroxide solution. Such wet etching can be anisotropic. When the third groove 341 is wet etched, a sidewall and a bottom of the third groove 341 can be simultaneously etched by the etching solution such that the second groove 340 having a Σ-shaped sidewall can be formed. The Σ-shaped sidewall of the second groove 340 can have a portion protruding toward the channel region.

In various embodiments, the protruded sidewall of the second groove can have a protrusion length toward the channel region, e.g., from an original sidewall position (e.g., the sidewall of the third groove 341 perpendicular to substrate surface) to a maximum point of the protrusion in a direction parallel to the substrate surface. In one embodiment, the protrusion length can be in a range of from about 10 nm to about 40 nm without limitation.

During the wet etching, an etching rate can be different in a different crystal direction of the semiconductor substrate 300. In one embodiment, the semiconductor substrate 300, e.g., a silicon substrate, can have a crystal direction of <100>. The etching rate along the crystal direction <100> of the silicon substrate can be faster than that along other directions that are different from the crystal direction <100>. Therefore, depending on the crystal direction of the semiconductor substrate, the degree of the sidewall protrusion toward the channel region under the gate structure can be controlled. The tensile stress generated in the channel region, e.g., especially near the second groove 340, can then be controlled.

For example, by choosing a suitable crystal direction of a semiconductor substrate, the protruded sidewall can have high degree of protrusion, e.g., can be formed inserting deeply toward the channel region under the gate structure. The high degree of the sidewall protrusion can cause large tensile stress in the channel region adjacent to the second groove 340.

Because of the sidewall protrusion of the second groove 340 toward the channel region, the crystal lattice structure of the channel region near the second groove 340 can be effectively stretched. Stressing materials can be subsequently filled in the first groove 330 and the second groove 340. The stress generated by the stressing material in the second groove 340 can be greater than the stress generated by the stressing material in the first groove 330. The stress generated in the channel region near the second groove 340 can thus be greater than the stress generated in the channel region near the first groove 330.

Figure 8:
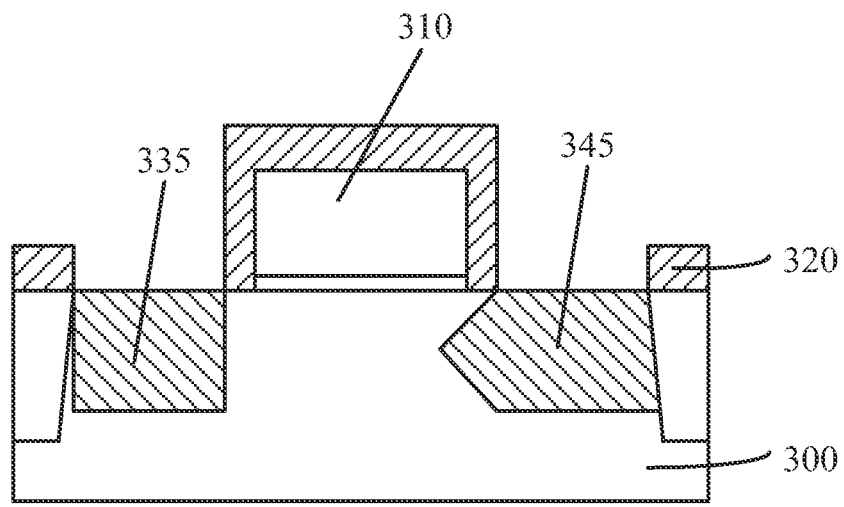

In Step S106 of FIG. 2 and referring to FIG. 8, the photoresist pattern 350 can be removed and a stressing material can be filled in the first groove 330 and the second groove 340, e.g., using selective epitaxy. The stressing material in the first groove 330 and the second groove 340 can form a source region 335 and a drain region 345.

In one embodiment, the photoresist pattern 350 can be removed by, e.g., an ashing process. After removing the photoresist pattern, the first groove 330, the second groove 340, and the hard mask layer 320 can be exposed. The stressing material can then be filled in the first groove 330 and the second groove 340 using the hard mask layer 320 as a mask. For example, the filling of the stressing material can be performed by a selective epitaxy including molecular beam epitaxy, chemical vapor phase epitaxy, etc.

In one embodiment, the MOS transistor can be an NMOS transistor and the epitaxial stressing material can be, for example, a tensile stressing material, such as a silicon carbide layer. The silicon carbide layer can have carbon concentration in a range of from about 0% to about 50% by mole percentage of the total silicon carbide layer. A tensile stress generated in a channel region of the NMOS transistor can be increased by varying the concentration (e.g., mole percentage) of carbon in the silicon carbide layer. The source-drain saturation current of the NMOS transistor can then be increased.

In a specific embodiment, the silicon carbide layer can be formed by a process including: forming a silicon carbide layer in the first groove 330 and the second groove 340 by a selective epitaxy, e.g., by low pressure chemical vapor deposition (LPCVD) under a temperature in a range from about 500° C. to about 575° C. and in an active gas including, e.g., $C_4H_8$ and tetramethylsilane; and in-situ doping the silicon carbide layer with n-type impurity ions when forming the silicon carbide in the first groove and the second groove by the LPCVD, so that the silicon carbide layer in the first groove 330 and the second groove 340 can form a source region 335 and a drain region 345. The concentration of carbon in the silicon carbide layer can be varied by varying a ratio between $C_4H_8$ and tetramethylsilane during the formation.

In another embodiment, the MOS transistor can be a PMOS transistor and the epitaxial stressing material can be, for example, a compressive stressing material, such as silicon germanium. The formed silicon germanium layer can have a germanium concentration in a range of from about 0% to about 70% by mole percentage of a total silicon germanium layer. A compressive stress generated in a channel region of the PMOS transistor can be increased by varying the concentration (e.g., mole percentage) of germanium in the silicon germanium layer. A source-drain saturation current of the PMOS transistor can then be increased. The silicon germanium layer can be in-situ doped with p-type impurity ions when the silicon germanium layer is formed in the first groove and the second groove by selective epitaxy so that the silicon germanium layer in the first groove and the second groove can form a source region and a drain region.

In various embodiments, the stressing material in the first groove and the second groove can be formed in separate steps or processes. In addition, when the stressing material is silicon germanium, the formed silicon germanium layer in the second groove can have a germanium concentration greater than the silicon germanium layer formed in the first groove. When the stressing material is silicon carbide, the silicon carbide layer formed in the second groove can have a carbon concentration greater than the silicon carbide layer formed in the first groove. In this manner, the channel region near the second groove can generate a stress greater than the channel region near the first groove.

In other embodiments, the source region and the drain region can further be doped by ion implantations to increase doping concentrations and to effectively reduce source-drain resistance. Device performance can be improved.

Figure 9:
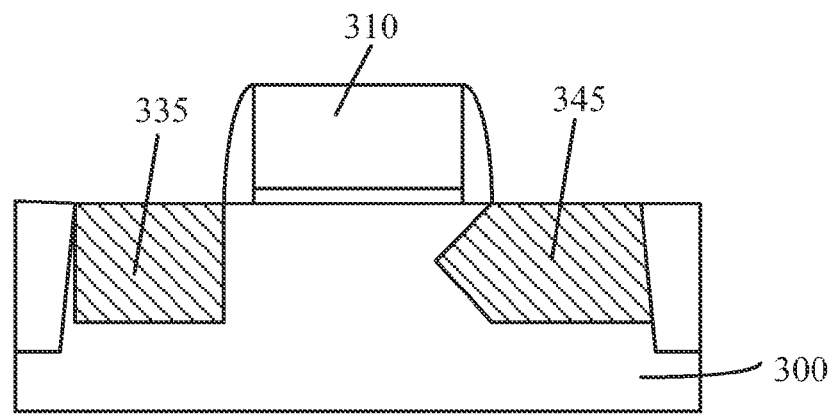

In Step S107 of FIG. 2 and referring to FIG. 9, the hard mask layer 320 can be removed, e.g., by a wet etching or a dry etching. After the removal of the hard mask layer, a sidewall spacer (not shown) can be formed on a sidewall surface of the gate structure 310. In some embodiments, n-type or p-type ion implantations with respect to the source region and the drain region can be performed after formation of the sidewall spacer.

In various embodiments, an MOS transistor is disclosed. The MOS transistor can have a structure, e.g., as shown in FIG. 9. For example, the MOS transistor can include a semiconductor substrate 300, a gate structure 310 formed on a surface of the semiconductor substrate 300, a first groove 330 formed in the semiconductor substrate 300 on one side of the gate structure 310, and a second groove 340 formed in the semiconductor substrate 300 on an other side of the gate structure 310. The first groove 330 and the second groove 340 can be filled with a stressing material. The stressing material in the first groove 330 and the second groove 340 can form a source region 335 and a drain region 345.

The first groove 330 can have a sidewall perpendicular to the surface of the semiconductor substrate 300 (i.e., substrate surface) and the second groove 340 can have a sidewall protruded toward a channel region of the MOS transistor. In various embodiments, the protruded sidewall can have a protrusion length in a direction parallel to the substrate surface ranging from about 10 nm to about 40 nm. In various embodiments, the first groove 330 and the stressing material filled therein can be U-shaped, while the second groove 340 and the stressing material filled therein can be Sigma-shaped.

The MOS transistor can be an NMOS transistor. Correspondingly, the stressing material can be a tensile stressing material, e.g., silicon carbide. The silicon carbide layer can have a carbon concentration ranging from about 0% to about 50% by mole percentage of the total silicon carbide layer. Impurity ions doped in the source region and the drain region can be n-type impurity ions. In some embodiments, the silicon carbide layer in the first groove 330 and the second groove 340 can have carbon concentration in a same range. In other embodiments, the silicon carbide layer in the second groove can have a carbon concentration greater than the silicon carbide layer in the first groove 330. As a result, tensile stress generated in the channel region near the second groove can be greater than the tensile stress generated in the channel region near the first groove.

The MOS transistor also be a PMOS transistor. Correspondingly, the stressing material can be a compressive stressing material, e.g., silicon germanium. The formed silicon germanium layer can have a germanium concentration ranging from about 0% to about 70% by mole percentage of the total silicon germanium layer. Impurity ions doped in the source region and the drain region can be p-type impurity ions. In some embodiments, the silicon germanium layer in the first groove 330 and the second groove 340 can have germanium concentration in a same range. In other embodiments, the silicon germanium layer in the second groove can have a germanium concentration greater than the silicon germanium layer in the first groove 330. As a result, compressive stress generated in the channel region near the second groove can be greater than the compressive stress generated in the channel region near the first groove.

Because the second groove of the MOS transistor has a protruded sidewall toward the channel region and the first groove has a sidewall perpendicular to the substrate surface, the stress generated in the second groove by the stressing material can be greater than the stress generated in the first groove by the stressing material. Saturation mobility of the carriers in the channel region near the second groove can be larger than that in the channel region near the first groove. When the MOS transistor is in a saturation region and a source-drain voltage is greater than or equal to a source-drain saturation voltage, the channel region can be pinched off. In this case, the channel region can only exist between a channel pinch-off point and the source region or the drain region that is set at a low level.

Therefore, the saturation mobility of carriers (and thus the source-drain saturation current) of the MOS transistor can depend on the saturation mobility of the carriers in the channel region near the source region or the drain region that is set at the low level. The pinched off channel region can be near the source region or the drain region, and the stress in the channel region near the source region or drain region can have different magnitude. Carries can have different saturation mobility in a different current direction. The source-drain saturation current of the MOS transistor can be different in different current directions.

The disclosed MOS transistor can be used as a transfer transistor of an SRAM memory cell. Because the source-drain saturation current passing through such transfer transistor in one current direction can be larger than that in another current direction, both the read and write margins of the SRAM memory cell can be increased at the same time.

Figure 10:
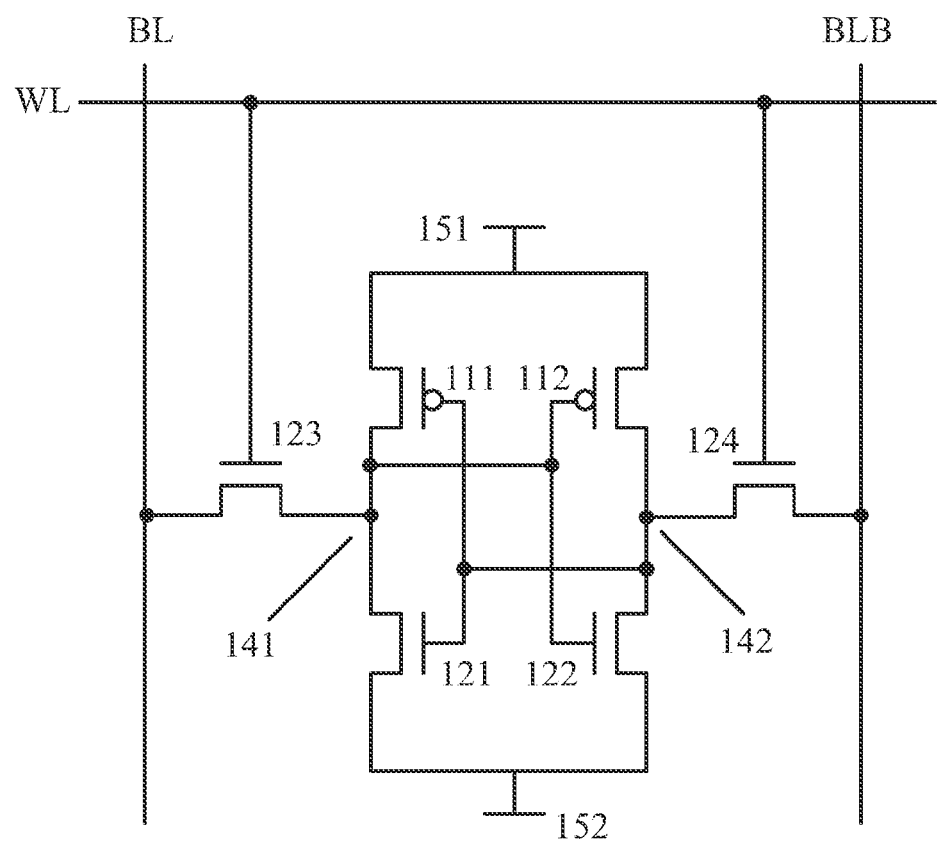
FIG. 10 depicts an exemplary SRAM memory cell circuit in accordance with various disclosed embodiments.

As disclosed herein, an SRAM memory cell circuit can be formed using the MOS transistor as a transfer transistor. FIG. 10 depicts a schematic structural diagram of an exemplary SRAM memory cell circuit in accordance with various disclosed embodiments.

As shown in FIG. 10, SRAM memory cell circuit can include, for example, a first PMOS transistor 111, a second PMOS transistor 112, a first NMOS transistor 121, a second NMOS transistor 122, a third NMOS transistor 123 and/or a fourth NMOS transistor 124.

A gate of the second PMOS transistor 112, a gate of the second NMOS transistor 122, a drain of the first PMOS transistor 111, a drain of the first NMOS transistor 121, and a source of the third NMOS transistor 123 can be electrically connected to form a first storage node 141. A gate of the first PMOS transistor 111, a gate of the first NMOS transistor 121, a drain of the second PMOS transistor 112, a drain of the second NMOS transistor 122, and a source of the fourth NMOS transistor 124 can be electrically connected to form a second storage node 142.

The first PMOS transistor 111, the second PMOS transistor 112, the first NMOS transistor 121, and the second NMOS transistor 122 can form a bistable circuit. The first PMOS transistor 111 and the second PMOS transistor 112 can be pull-up transistors. The first NMOS transistor 121 and the second NMOS transistor 122 can be pull-down transistors.

The third NMOS transistor 123 and the fourth NMOS transistor 124 can be used as transfer transistors and can connect a first bit line BL and a second bit line BLB with the bistable circuit. Gates of the third NMOS transistor 123 and the fourth NMOS transistor 124 can be electrically connected to a word line WL. A drain of the third NMOS transistor 123 can be electrically connected to the first bit line BL. A drain of the fourth NMOS transistor 124 can be electrically connected to the second bit line (complementary bit line) BLB. A source of the first PMOS transistor 111 and a source of the second PMOS transistor 112 can be electrically connected to a power supply terminal 151. A source of the first NMOS transistor 121 and a source of the second NMOS transistor 122 can be electrically connected to a ground terminal 152.

A first groove and a second groove can be provided on both sides of a gate structure of each of the third NMOS transistor 123 and the fourth NMOS transistor 124. The first groove and the second groove can be filled with a tensile stressing layer such as a silicon carbide layer. The silicon carbide layer in the first groove can be used as a source region of each of the third NMOS transistor 123 and the fourth NMOS transistor 124. The silicon carbide layer in the second groove can be used as a drain region of each of the third NMOS transistor 123 and the fourth NMOS transistor 124. A sidewall of the first groove can be perpendicular to a surface of a semiconductor substrate and a sidewall of the second groove can protrude toward a channel region.

In one embodiment, the first PMOS transistor 111 and the second PMOS transistor 112 can have a same or similar device structure. The first NMOS transistor 121 and the second NMOS transistor 122 can have a same or similar device structure. The third NMOS transistor 123 and the fourth NMOS transistor 124 can have a same or similar device structure.

Carbon concentration in the silicon carbide layer in the first groove and the second groove of each of the third NMOS transistor 123 and the fourth NMOS transistor 124 can be in a range of from about 0% to about 50% by mole percentage of the total silicon carbide layer. The source region and the drain region can be doped with n-type impurity ions. In some embodiments, the first groove 330 and the second groove 340 can include a silicon carbide layer having a same carbon concentration. In other embodiments, the silicon carbide layer in the second groove can have a carbon concentration greater than the silicon carbide layer in the first groove. As a result, the tensile stress in the channel region near the second groove can be greater than the tensile stress in the channel region near the first groove.

The second groove of each of the third NMOS transistor 123 and the fourth NMOS transistor 124 can have a protruded sidewall toward the channel region, and the first groove can have a sidewall perpendicular to the substrate surface. The stress generated by the silicon carbide layer in the second groove can be greater than that generated in the first groove. Saturation mobility of the carriers in the channel region near the second groove can be larger than that in the channel region near the first groove. In one embodiment, the silicon carbide layer in the second groove can be used as the drain region of each of the third NMOS transistor 123 and the fourth NMOS transistor 124. The silicon carbide layer in the first groove can be used as the source region of each of the third NMOS transistor 123 and the fourth NMOS transistor 124.

Therefore, the mobility of the carriers in the channel region near the drain can be larger than that in the channel region near the source. When a current flows from the first storage node 141 to the first bit line or from the second storage node 142 to the second bit line, the saturation mobility of the third NMOS transistor 123 and the fourth NMOS transistor 124 can be large. On the other hand, when a current flows from the first bit line to the first storage node 141 or from the second bit line to the second storage node 142, the saturation mobility of the third NMOS transistor 123 and the fourth NMOS transistor 124 can be small.

In a read operation of the SRAM memory, the word line WL can be set at a high level so that the third NMOS transistor 123 and the fourth NMOS transistor 124 can become conductive. The first bit line BL and the second bit line BLB can be set at a high level. One of the first storage node 141 and the second storage node 142 can be set at a low level. Therefore, a current can flow from the first bit line BL and the second bit line BLB to the first storage node 141 or the second storage node 142 that is set at a low level.

The electric potential of the first bit line BL or the second bit line BLB can decrease so that a voltage can be generated between the electric potentials of the first bit line BL and the second bit line BLB. After the voltage reaches a certain value, a sensitivity amplifier (not shown) that is connected to the first bit line BL and the second bit line BLB can be activated to amplify the voltage and then transfer the voltage to an output circuit (not shown) for data reading.

In a write operation of the SRAM memory, the word line WL can be set at a high level so that the third NMOS transistor 123 and the fourth NMOS transistor 124 become conductive. One of the first bit line BL and the second bit line BLB can be set at a high level and the other can be set at a low level. One of the first storage node 141 and the second storage node 142 can be at a high level and the other can be at a low level.

When the data information of the write operation is different from the originally stored data information, a current can flow from the first storage node 141 that is set at the high level to the first bit line BL that is set at the low level or flow from the second storage node 142 that is set at the high level to the second bit line BLB that is set at the low level. The electric potential of one of the first storage node 141 and the second storage node 142 that is set at the high level can be increased. The electric potential of the other one of the first storage node 141 and the second storage node 142 that is set at a low level can also be increased. New data can be thus stored in the SRAM memory cell.

In one embodiment, when a current flows from the first storage node 141 to the first bit line or from the second storage node 142 to the second bit line, the saturation mobility of the third NMOS transistor 123 and the fourth NMOS transistor 124 can be large. On the other hand, when a current flows from the first bit line to the first storage node 141 or from the second bit line to the second storage node 142, the saturation mobility of the third NMOS transistor 123 and the fourth NMOS transistor 124 can be small. That is, in the read operation, the source-drain saturation current of the third NMOS transistor 123 and the fourth NMOS transistor 124 can be small. In the write operation, the source-drain saturation current of the third NMOS transistor 123 and the fourth NMOS transistor 124 can be large.

The read margin can depend on a ratio between the source-drain saturation current of a pull-down NMOS transistor and the source-drain saturation current of a transfer transistor. The write margin can depend on a ratio between the source-drain saturation current of a transfer transistor and the source-drain saturation current of a pull-up PMOS transistor. When the pull-down NMOS transistor and the pull-up PMOS transistor are kept unchanged or consistent, the write margin and the read margin of the SRAM memory cell can be simultaneously increased to improve the stability of the SRAM memory cell.

Figure 11:
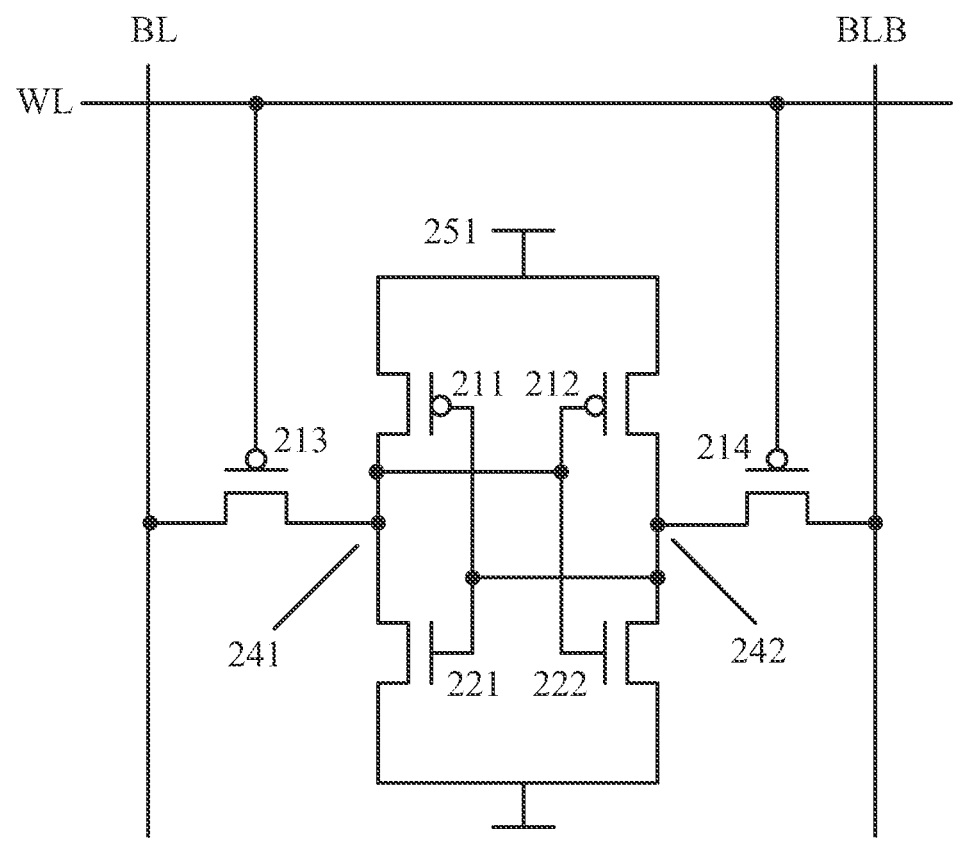
FIG. 11 depicts another exemplary SRAM memory cell circuit in accordance with various disclosed embodiments.

In various embodiments, another exemplary SRAM memory cell circuit can be provided using the disclosed MOS transistor as a transfer transistor. FIG. 11 depicts a schematic structural diagram of another exemplary SRAM memory cell circuit in accordance with various disclosed embodiments.

As shown in FIG. 9, SRAM memory cell circuit can include, for example, a first PMOS transistor 211, a second PMOS transistor 212, a third PMOS transistor 213, a fourth PMOS transistor 214, a first NMOS transistor 221, and/or a second NMOS transistor 222.

A gate of the second PMOS transistor 212, a gate of the second NMOS transistor 222, a drain of the first PMOS transistor 211, a drain of the first NMOS transistor 221, and a source of the third PMOS transistor 213 can be electrically connected to form a first storage node 241. A gate of the first PMOS transistor 211, a gate of the first NMOS transistor 221, a drain of the second PMOS transistor 212, a drain of the second NMOS transistor 222, and a source of the fourth PMOS transistor 214 can be electrically connected to form a second storage node 242.

The first PMOS transistor 211, the second PMOS transistor 212, the first NMOS transistor 221, and the second NMOS transistor 222 can form a bistable circuit. The first PMOS transistor 211 and the second PMOS transistor 212 can be pull-up transistors. The first NMOS transistor 221 and the second NMOS transistor 222 can be pull-down transistors.

The third PMOS transistor 213 and the fourth PMOS transistor 214 can be used as transfer transistors and can connect a first bit line BL and a second bit line BLB with the bistable circuit. Gates of the third PMOS transistor 213 and the fourth PMOS transistor 214 can be electrically connected to a word line WL. A drain of the third PMOS transistor 213 can be electrically connected to a first bit line BL and a drain of the fourth PMOS transistor 214 can be electrically connected to a second bit line (complementary bit line) BLB. A source of the first PMOS transistor 211 and a source of the second PMOS transistor 212 can be electrically connected to a power supply terminal 251. A source of the first NMOS transistor 221 and a source of the second NMOS transistor 222 can be electrically connected to a ground terminal 252.

A first groove and a second groove can be provided on both sides of a gate structure of each of the third PMOS transistor 213 and the fourth PMOS transistor 214. The first groove and the second groove can be filled with a compressive stressing layer such as a silicon germanium layer. The silicon germanium layer in the first groove can be used as a source region of each of the third PMOS transistor 213 and the fourth PMOS transistor 214. The silicon germanium layer in the second groove can be used as a drain region of each of the third PMOS transistor 213 and the fourth PMOS transistor 214. A sidewall of the first groove can be perpendicular to a surface of a semiconductor substrate and a sidewall of the second groove can protrude toward a channel region.

Specifically, the first PMOS transistor 211 and the second PMOS transistor 212 can have a same or similar device structure. The first NMOS transistor 221 and the second NMOS transistor 222 can have a same or similar device structure. The third PMOS transistor 213 and the fourth PMOS transistor 214 can have a same or similar device structure.

The silicon germanium layer in the first groove and the second groove of each of the third PMOS transistor 213 and the fourth PMOS transistor 214 can have a germanium concentration ranging from about 0% to about 70% by mole percentage of the total silicon germanium layer. The source/drain regions can be doped with p-type impurity ions. In some embodiments, the silicon germanium layer in the first groove 330 and the second groove 340 can have same germanium concentration. In other embodiments, the silicon germanium layer in the second groove can have a germanium concentration greater than that in the first groove. Compressive stress generated in the channel region near the second groove can be greater than the compressive stress generated in the channel region near the first groove.

Because the second groove of the MOS transistor has a protruded sidewall toward the channel region and the first groove has a sidewall perpendicular to the substrate surface, the stress generated in the second groove by the stressing material can be greater than the stress generated in the first groove by the stressing material. Saturation mobility of the carriers in the channel region near the second groove can be larger than that in the channel region near the first groove In one embodiment, the silicon germanium layer in the second groove can be used as the drain region of each of the third PMOS transistor 213 and the fourth PMOS transistor 214 and the silicon germanium layer in the first groove can be used as the source region of each of the third PMOS transistor 213 and the fourth PMOS transistor 214. Therefore, the mobility of the carriers in the channel region near the drain can be larger than that in the channel region near the source. When a current flows from the first storage node 241 to the first bit line or from the second storage node 242 to the second bit line, the saturation mobility of the third PMOS transistor 213 and the fourth PMOS transistor 214 can be large. On the other hand, when a current flows from the first bit line to the first storage node 241 or from the second bit line to the second storage node 242, the saturation mobility of the third PMOS transistor 213 and the fourth PMOS transistor 214 can be small.

In a read operation of the SRAM memory, the word line WL can be set at a high level so that the third PMOS transistor 213 and the fourth PMOS transistor 214 can become conductive. The first bit line BL and the second bit line BLB can be set at a high level. One of the first storage node 241 and the second storage node 242 can be set at a low level. Therefore, a current can flow from the first bit line BL and the second bit line BLB to the first storage node 241 or the second storage node 242 that is set at a low level.

The electric potential of the first bit line BL or the second bit line BLB can decrease so that a voltage can be generated as a difference between the electric potentials of the first bit line BL and the second bit line BLB. After the voltage reaches a certain value, a sensitivity amplifier (not shown) that is connected to the first bit line BL and the second bit line BLB can be activated to amplify the voltage and then transfer the voltage to an output circuit (not shown) for data reading.

In a write operation of the SRAM memory, the word line WL can be set at a high level so that the third PMOS transistor 213 and the fourth PMOS transistor 214 can become conductive. One of the first bit line BL and the second bit line BLB can be set at a high level and the other can be set at a low level. One of the first storage node 241 and the second storage node 242 can be at a high level and the other can be at a low level. When data information of the write operation is different from originally stored data information, a current can flow from the first storage node 241 that is set at the high level to the first bit line BL that is set at the low level or flow from the second storage node 242 that is set at the high level to the second bit line BLB that is set at the low level.

Electric potential of one of the first storage node 241 and the second storage node 242 that is set at the high level can be increased. Electric potential of the other one of the first storage node 241 and the second storage node 242 that is set at the low level can also be increased. New data can be stored in the SRAM memory cell.

In one embodiment, when a current flows from the first storage node 241 to the first bit line or from the second storage node 242 to the second bit line, the saturation mobility of the third PMOS transistor 213 and the fourth PMOS transistor 214 can be large. On the other hand, when a current flows from the first bit line to the first storage node 241 or from the second bit line to the second storage node 242, the saturation mobility of the third PMOS transistor 213 and the fourth PMOS transistor 214 can be small.

That is, in the read operation, the source-drain saturation current of the third PMOS transistor 213 and the fourth PMOS transistor 214 can be small. In the write operation, the source-drain saturation current of the third PMOS transistor 213 and the fourth PMOS transistor 214 can be large. The read margin can depend on a ratio between the source-drain saturation current of a pull-down NMOS transistor and the source-drain saturation current of a transfer transistor. The write margin can depend on a ratio between the source-drain saturation current of a transfer transistor and the source-drain saturation current of a pull-up PMOS transistor. When the pull-down NMOS transistor and the pull-up PMOS transistor are kept unchanged or consistent, the write margin and the read margin of the SRAM memory cell can be simultaneously increased to improve the stability of the SRAM memory cell.

In a specific embodiment where transfer (or pass-gate) PMOS transistors (e.g., the third PMOS transistor 213 and the fourth PMOS transistor 214) are configured in a 6T SRAM as shown in FIG. 11, an exemplary U-shaped SiGe source can be connected to the internal nodes such as the storage nodes 241 and 242, while an exemplary SiGe drain can be connected to the bit-lines (BL). Large source-to-drain current and small source-to-drain current can thus be provided.

In this manner, the disclosed MOS transistor can include a semiconductor substrate, a gate structure formed on a surface of the semiconductor substrate, a first groove formed in the semiconductor substrate on one side of the gate structure, and a second groove formed in the semiconductor substrate on an other side of the gate structure. The first groove and the second groove can be filled with a stressing material. A sidewall of the first groove can be perpendicular to the surface of the semiconductor substrate. A sidewall of the second groove can protrude toward a channel region side. The stress in the channel region of the MOS transistor can be asymmetric. In other words, the channel region can include an asymmetric stressing layer. Therefore, the source-drain saturation current of the MOS transistor can be different in a different current direction.

In the disclosed SRAM memory cell, the stress in the channel region of a transfer transistor can be asymmetric. This can allow the source-drain saturation current of the transfer transistor in a write operation to be increased and, at the same time, to allow the source-drain saturation current of the transfer transistor in a read operation to be decreased. Both the read margin and the write margin of the SRAM memory cell can be increased. Read-write stability of the SRAM memory cell can be increased.

It should be noted that the scope of the present disclosure is not intended to be limited by the embodiments described above. Other applications, advantages, alternations, modifications, or equivalents to the disclosed embodiments are obvious to those skilled in the art and within the scope of the present disclosure.

What is claimed is:

1. An MOS transistor comprising:
a semiconductor substrate; a gate structure disposed on a surface of the semiconductor substrate, wherein the semiconductor substrate includes a first groove on one side of the gate structure and a second groove on an other side of the gate structure, and wherein the first groove has a sidewall adjacent to a channel region and perpendicular to the surface of the semiconductor substrate and the second groove has a sidewall protruding into the channel region under the gate structure, and wherein the first groove has a bottom surface directly connected and perpendicular to the sidewall adjacent to the channel region; and a stressing material disposed in each of the first groove and the second groove, wherein the stressing material is silicon carbide having a carbon concentration in the protruded second groove greater than in the first groove, or is silicon germanium having a germanium concentration in the protruded second groove greater than in the first groove.

2. The transistor of claim 1, wherein the MOS transistor is an NMOS transistor and the stressing material includes a tensile stressing material.

3. The transistor of claim 2, wherein the tensile stressing material includes the silicon carbide having a carbon concentration ranging from about 0% to about 50% by mole percentage of a total silicon carbide.

4. The transistor of claim 1, wherein the MOS transistor is a PMOS transistor and the stressing material includes a compressive stressing material.

5. The transistor of claim 4, wherein the compressive stressing material includes the silicon germanium having a germanium concentration ranging from about 0% to about 70% by mole percentage of a total silicon germanium.

6. An SRAM memory cell circuit comprising:
a first transfer transistor including a gate electrically connected to a word line, a source electrically connecting to a first storage node, and a drain electrically connecting to a first bit line; a second transfer transistor including a gate electrically connected to the word line, a source electrically connecting to a second storage node, and a drain electrically connecting to a second bit line, wherein each of the first transfer transistor and the second transfer transistor includes: a semiconductor substrate including a first groove on one side of the gate and a second groove on an other side of the gate, wherein the first groove has a sidewall adjacent to a channel region and perpendicular to a surface of the semiconductor substrate and a sidewall of the second groove protrudes into the channel region under the gate, and wherein the first groove has a bottom surface directly connected and perpendicular to the sidewall adjacent to the channel region; and a stressing material disposed in the first groove to form the drain and in the second groove to form the source, wherein the stressing material is silicon carbide having a carbon concentration in the protruded second groove greater than in the first groove, or is silicon germanium having a germanium concentration in the protruded second groove greater than in the first groove.

7. The circuit of claim 6, wherein each of the first transfer transistor and the second transfer transistor is an NMOS transistor and the stressing material includes a tensile stressing material including the silicon carbide.

8. The circuit of claim 6, wherein each of the first transfer transistor and the second transfer transistor is a PMOS transistor and the stressing material includes a compressive stressing material including the silicon germanium.

9. The circuit of claim 6, further including:
a first PMOS transistor;
a second PMOS transistor;
a first NMOS transistor; and
a second NMOS transistor; wherein
the first storage node electrically connects a gate of the second PMOS transistor, a gate of the second NMOS transistor, a drain of the first PMOS transistor, a drain of the first NMOS transistor and the source of the first transfer transistor;
the second storage node electrically connects a gate of the first PMOS transistor, a gate of the first NMOS transistor, a drain of the second PMOS transistor, a drain of the second NMOS transistor, and the source of the second transfer transistor;
sources of the first and second PMOS transistors are electrically connected to a power supply terminal; and
sources of the first and second NMOS transistor are electrically connected to a ground terminal.

10. A method for forming an MOS transistor comprising:
providing a semiconductor substrate;
forming a gate structure on a surface of the semiconductor substrate;
forming a first groove in the semiconductor substrate on one side of the gate structure, wherein the first groove has a sidewall perpendicular to the surface of the semiconductor substrate;
forming a second groove in the semiconductor substrate on an other side of the gate structure, wherein the second groove has a sidewall protruding toward the channel region, wherein the first groove and the second groove are formed by:

forming a hard mask layer on the surface of the semiconductor substrate and a surface of the gate structure, the hard mask layer exposing surface portions of the semiconductor substrate on both sides of the gate structure;
dry etching the semiconductor substrate on both sides of the gate structure using the hard mask layer as a mask to form the first groove and a third groove, wherein each of the first groove and the third groove has a sidewall perpendicular to the surface of the semiconductor substrate;
forming a photoresist pattern on surfaces of each of the semiconductor substrate and the gate structure, the photoresist pattern exposing the third groove; and
wet etching the third groove to form the second groove such that the sidewall of the second groove protrudes toward the channel region; and
filling each of the first groove and the second groove with a stressing material to form a source region and a drain region.

11. The method of claim 10, wherein the stressing material is filled in each of the first groove and the second groove by a selective epitaxy.

12. The method of claim 10, wherein the MOS transistor is a PMOS transistor and the stressing material includes a compressive stressing material including silicon germanium.

13. The method of claim 12, wherein the silicon germanium in the first groove and the second groove is formed in separate steps, and the silicon germanium in the second groove has a germanium concentration greater than the silicon germanium in the first groove.

14. The method of claim 10, wherein the MOS transistor is an NMOS transistor and the stressing material includes a tensile stressing material including silicon carbide.

15. The method of claim 14, wherein the silicon carbide in the first groove and the second groove is formed in separate steps, and the silicon carbide in the second groove has a carbon concentration greater than the silicon carbide in the first groove.

* * * * *